(12) United States Patent
Peng

(10) Patent No.: US 10,039,164 B1
(45) Date of Patent: Jul. 31, 2018

(54) SEQUENCING METHOD FOR LIGHT-EMITTING DIODE LAMP STRING

(71) Applicant: Semisilicon Technology Corp., New Taipei (TW)

(72) Inventor: Wen-Chi Peng, New Taipei (TW)

(73) Assignee: SEMISILICON TECHNOLOGY CORP., New Taipei (TW)

( * ) Notice: Subject to any disclaimer, the term of this patent is extended or adjusted under 35 U.S.C. 154(b) by 0 days.

(21) Appl. No.: 15/887,705

(22) Filed: Feb. 2, 2018

(51) Int. Cl.
*H05B 33/08* (2006.01)
*H01L 29/866* (2006.01)
*H01L 25/075* (2006.01)
*H01L 25/16* (2006.01)

(52) U.S. Cl.
CPC ......... *H05B 33/083* (2013.01); *H05B 33/089* (2013.01); *H05B 33/0842* (2013.01); *H01L 25/0753* (2013.01); *H01L 25/167* (2013.01); *H01L 29/866* (2013.01)

(58) Field of Classification Search
None
See application file for complete search history.

(56) References Cited

U.S. PATENT DOCUMENTS

2013/0147370 A1\* 6/2013 Williams ........... H05B 33/0827
315/185 R
2016/0360144 A1\* 12/2016 Williams ............. H05B 33/083

\* cited by examiner

*Primary Examiner* — Jany Richardson
(74) *Attorney, Agent, or Firm* — Muncy, Geissler, Olds & Lowe, P.C.

(57) ABSTRACT

A sequencing method is applied to a light-emitting diode lamp string. The light-emitting diode lamp string includes a plurality of light-emitting diode units connected to each other in series. The light-emitting diode units have different parasitic capacitive reactance and resistance-capacitance time constant after being connected to each other in series. The sequencing method includes following steps. An address pulse wave signal is sent to the light-emitting diode units. A clamped voltage is sent to the light-emitting diode units when a voltage of the address pulse wave signal decreases. The light-emitting diode unit in a receiving status detects a receiving voltage of the light-emitting diode unit. The light-emitting diode unit detecting that the receiving voltage is less than a predetermined voltage due to an overshoot phenomenon stores the address pulse wave signal to have an address sequence data.

10 Claims, 3 Drawing Sheets

SEQUENCING METHOD FOR LIGHT-EMITTING DIODE LAMP STRING

BACKGROUND OF THE INVENTION

Field of the Invention

The present invention relates to a sequencing method, and especially relates to a sequencing method for a light-emitting diode lamp string.

Description of the Related Art

Light-emitting diodes are used widely to replace fluorescent lamps or bulbs. For example, the light-emitting diode lamp string comprising a plurality of light-emitting diodes is used to decorate buildings or for celebration. In order to drive the light-emitting diodes of the light-emitting diode lamp string to light diversely, the light-emitting diodes have different address sequence data. The light-emitting diodes receive a lighting signal comprising a lighting data and an address data. The light-emitting diode lights based on the lighting data of the lighting signal if the address sequence data of the light-emitting diode is equal to the address data of the lighting signal. The light-emitting diode ignores the lighting data of the lighting signal if the address sequence data of the light-emitting diode is not equal to the address data of the lighting signal.

Currently, most of the sequencing methods for the light-emitting diodes of the light-emitting diode lamp string are very complicated or difficult. For example, different address sequence data are burned into each of the light-emitting diodes before the light-emitting diodes are assembled as the light-emitting diode lamp string. Afterwards, the light-emitting diodes are arranged sequentially based on the address sequence data to be assembled as the light-emitting diode lamp string. The diverse lighting of the light-emitting diodes cannot be achieved correctly if the light-emitting diodes are not arranged sequentially based on the address sequence data.

SUMMARY OF THE INVENTION

In order to solve the above-mentioned problems, an object of the present invention is to provide a sequencing method for a light-emitting diode lamp string.

In order to achieve the object of the present invention mentioned above, the sequencing method of the present invention is applied to the light-emitting diode lamp string. The light-emitting diode lamp string comprises a plurality of light-emitting diode units connected to each other in series. The light-emitting diode units have different parasitic capacitive reactance and resistance-capacitance time constant after being connected to each other in series. The sequencing method comprises following steps. An address pulse wave signal is sent to the light-emitting diode units. A clamped voltage is sent to the light-emitting diode units if a voltage of the address pulse wave signal decreases. The light-emitting diode unit in a receiving status detects a receiving voltage of the light-emitting diode unit. The light-emitting diode unit detecting that the receiving voltage is less than a predetermined voltage due to an overshoot phenomenon stores the address pulse wave signal to have an address sequence data.

The advantage of the present invention is to simply perform the sequencing of the light-emitting diode units of the light-emitting diode lamp string.

Please refer to the detailed descriptions and figures of the present invention mentioned below for further understanding the technology, method and effect of the present invention. The figures are only for references and descriptions, and the present invention is not limited by the figures.

DETAILED DESCRIPTION OF THE INVENTION

Figure 1:
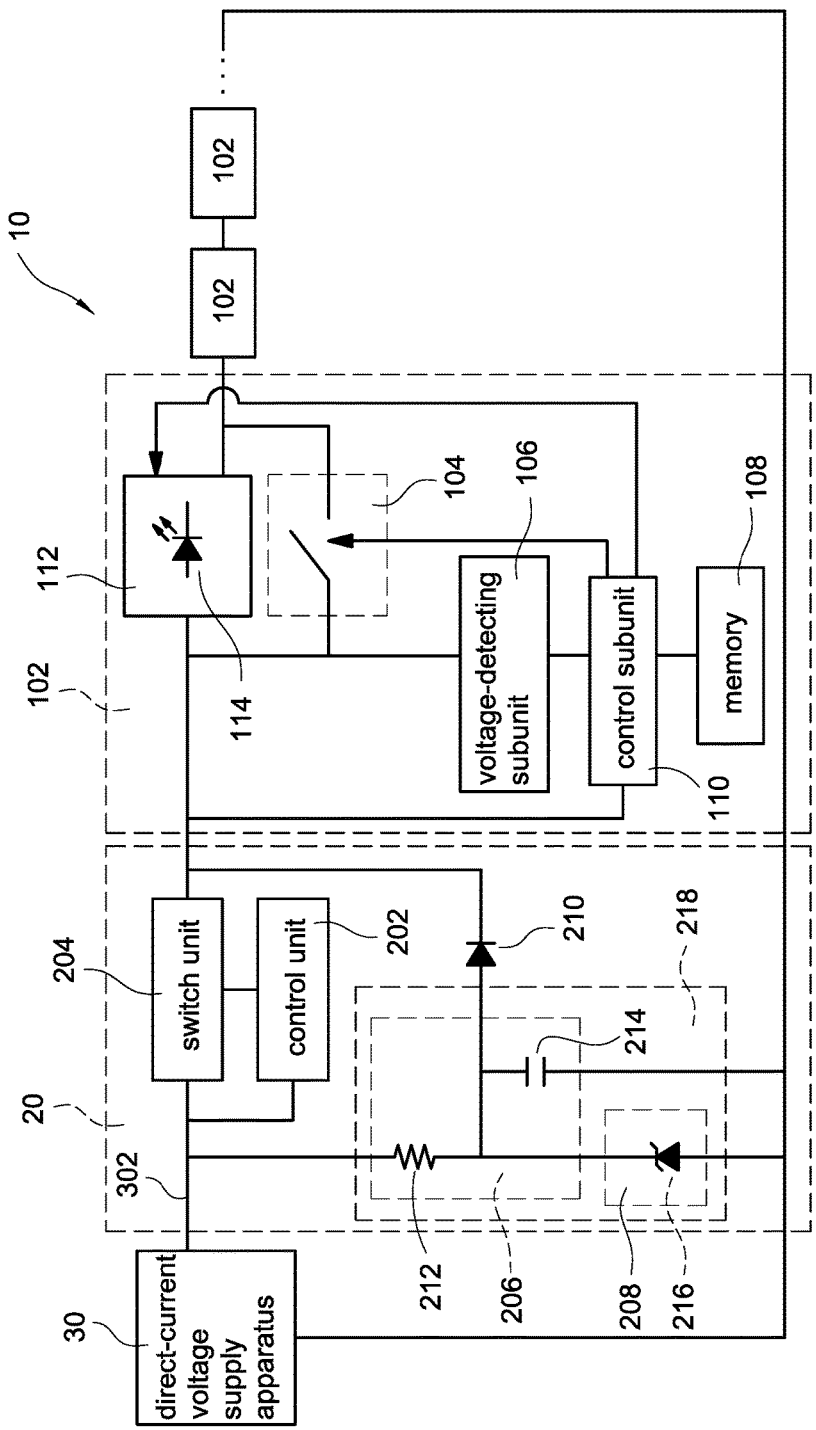
FIG. 1 shows a block diagram of an embodiment applied to a sequencing method for a light-emitting diode lamp string of the present invention.

In the present disclosure, numerous specific details are provided, to provide a thorough understanding of embodiments of the invention. Persons of ordinary skill in the art will recognize, however, that the present invention can be practiced without one or more of the specific details. In other instances, well-known details are not shown or described to avoid obscuring aspects of the present invention. Please refer to following detailed description and figures for the technical content of the present invention:

FIG. 1 shows a block diagram of an embodiment applied to a sequencing method for a light-emitting diode lamp string of the present invention. A sequencing method of the present invention is applied to a light-emitting diode lamp string 10, a light-emitting diode driving apparatus 20 and a direct-current voltage supply apparatus 30. The light-emitting diode lamp string 10 comprises a plurality of light-emitting diode units 102 connected to each other in series. The light-emitting diode driving apparatus 20 comprises a control unit 202, a switch unit 204, a signal voltage generation circuit 218 and a switch component 210. Each of the light-emitting diode units 102 comprises a by-pass subunit 104, a voltage-detecting subunit 106, a memory 108, a control subunit 110 and a light-emitting diode subunit 112. The signal voltage generation circuit 218 comprises a resistor-capacitor circuit 206 and a clamped voltage generation circuit 208. The resistor-capacitor circuit 206 comprises a resistor 212 and a capacitor 214. The clamped voltage generation circuit 208 comprises a Zener diode 216. The light-emitting diode subunit 112 comprises at least one light-emitting diode 114. The switch component 210 is, for example but the present invention is not limited to, a diode. The components mentioned above are electrically connected to each other.

After the components mentioned above are arranged and connected as shown in FIG. 1, the inventor of the present invention utilizes the delicate instrument to measure the parasitic capacitive reactance of each of the light-emitting diode units 102 respectively. The inventor of the present invention found that the light-emitting diode units 102 have different parasitic capacitive reactance after being connected to each other in series. In FIG. 1, the parasitic capacitive reactance of the first light-emitting diode unit 102 from left to right is less than the parasitic capacitive reactance of the second light-emitting diode unit 102 from left to right. The parasitic capacitive reactance of the second light-emitting diode unit 102 from left to right is less than the parasitic capacitive reactance of the third light-emitting diode unit 102 from left to right, and so on. Therefore, the light-emitting diode units 102 have different resistance-capacitance time constant after being connected to each other in series. In FIG. 1, the resistance-capacitance time constant of the first light-emitting diode unit 102 from left to right is less than the resistance-capacitance time constant of the second light-emitting diode unit 102 from left to right. The resistance-capacitance time constant of the second light-emitting diode unit 102 from left to right is less than the resistance-capacitance time constant of the third light-emitting diode unit 102 from left to right, and so on.

Figure 2:
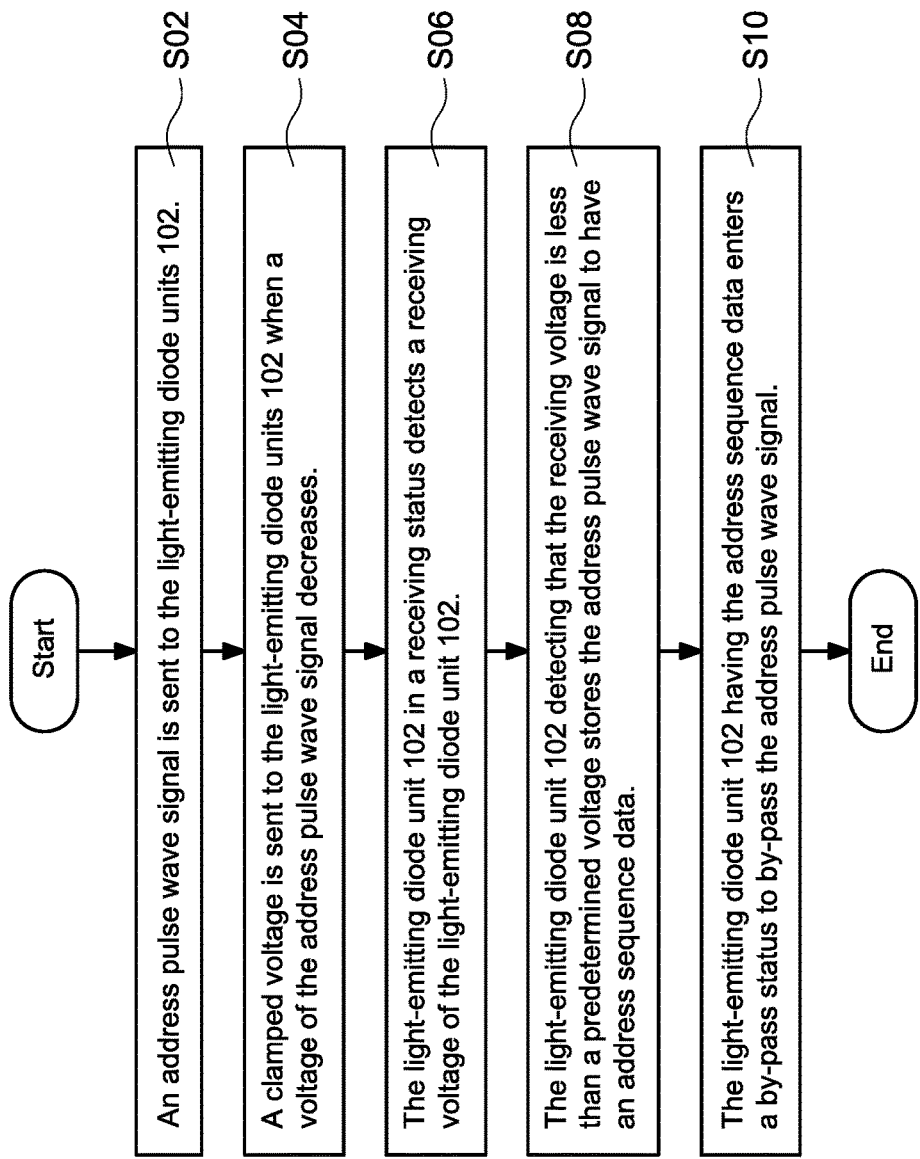
FIG. 2 shows a flow chart of an embodiment of the sequencing method for the light-emitting diode lamp string of the present invention.

FIG. 2 shows a flow chart of an embodiment of the sequencing method for the light-emitting diode lamp string of the present invention. Please refer to FIG. 1 at the same time. The sequencing method for the light-emitting diode lamp string 10 of the present invention basically comprises following five steps:

Step S02: An address pulse wave signal is sent to the light-emitting diode units 102. Then, the sequencing method of the present invention goes to a step S04.

Step S04: A clamped voltage is sent to the light-emitting diode units 102 when a voltage of the address pulse wave signal decreases. Moreover, the clamped voltage is sent to the light-emitting diode units 102 through the switch component 210. Because any electronic component delays to send the signal when the signal is passing through the electronic component, the step S04 is that the clamped voltage is delayed to be sent to the light-emitting diode units 102 when the voltage of the address pulse wave signal decreases. Then, the sequencing method of the present invention goes to a step S06.

Step S06: The light-emitting diode unit 102 in a receiving status detects a receiving voltage of the light-emitting diode unit 102. Then, the sequencing method of the present invention goes to a step S08.

Step S08: The light-emitting diode unit 102 detecting that the receiving voltage is less than a predetermined voltage stores the address pulse wave signal to have an address sequence data. More specifically, the light-emitting diode unit 102 detecting that the receiving voltage is less than the predetermined voltage due to an overshoot phenomenon stores the address pulse wave signal to have the address sequence data. Then, the sequencing method of the present invention goes to a step S10.

Step S10: The light-emitting diode unit 102 having the address sequence data enters a by-pass status to by-pass the address pulse wave signal.

Moreover, as mentioned above, the parasitic capacitive reactance of the light-emitting diode unit 102 which is in the receiving status and receives the address pulse wave signal firstly is the minimum. The resistance-capacitance time constant of the light-emitting diode unit 102 which is in the receiving status and receives the address pulse wave signal firstly is the minimum.

Following contents will describe the steps mentioned above in details:

The direct-current voltage supply apparatus 30 sends a direct-current voltage 302 to the light-emitting diode driving apparatus 20. The control unit 202 utilizes an on-off of the switch unit 204 to control the direct-current voltage 302 received by the switch unit 204 to generate the address pulse wave signal to send the address pulse wave signal to the light-emitting diode units 102. When the control unit 202 turns on the switch unit 204, the direct-current voltage 302 goes through the switch unit 204, but the direct-current voltage 302 does not enter the resistor-capacitor circuit 206, the clamped voltage generation circuit 208 and the switch component 210. When the control unit 202 turns off the switch unit 204 (at this time, namely, it is "when the voltage of the address pulse wave signal decreases" mentioned above), the direct-current voltage 302 does not go through the switch unit 204, but the direct-current voltage 302 enters the resistor-capacitor circuit 206 and the clamped voltage generation circuit 208. Then, the clamped voltage generation circuit 208 generates the clamped voltage, and the switch component 210 delays a delay time to send the clamped voltage to the light-emitting diode units 102. As mentioned above, because any electronic component delays to send the signal when the signal is passing through the electronic component, the delay time is generated by the switch component 210 spontaneously/naturally when the clamped voltage is sent to the light-emitting diode units 102 through the switch component 210.

Namely, the switch component 210 delays the clamped voltage generation circuit 208 to generate and send the clamped voltage to the light-emitting diode units 102. In other words, when the control unit 202 turns off the switch unit 204, the direct-current voltage 302 is sent (by the direct-current voltage supply apparatus 30) to the resistor-capacitor circuit 206, the clamped voltage generation circuit 208 and the switch component 210, so that the switch component 210 delays the clamped voltage generation circuit 208 to generate and send the clamped voltage to the light-emitting diode units 102. When the control unit 202 turns on the switch unit 204, the direct-current voltage supply apparatus 30 stops sending the direct-current voltage 302 to the resistor-capacitor circuit 206, the clamped voltage generation circuit 208 and the switch component 210. The reason for generating and sending the clamped voltage to the light-emitting diode units 102 is that: the voltage of the light-emitting diode lamp string 10 decreases because the voltage of the address pulse wave signal decreases, but the voltage of the light-emitting diode lamp string 10 cannot be zero, so that generating and sending the clamped voltage to the light-emitting diode units 102 is required.

Figure 3:
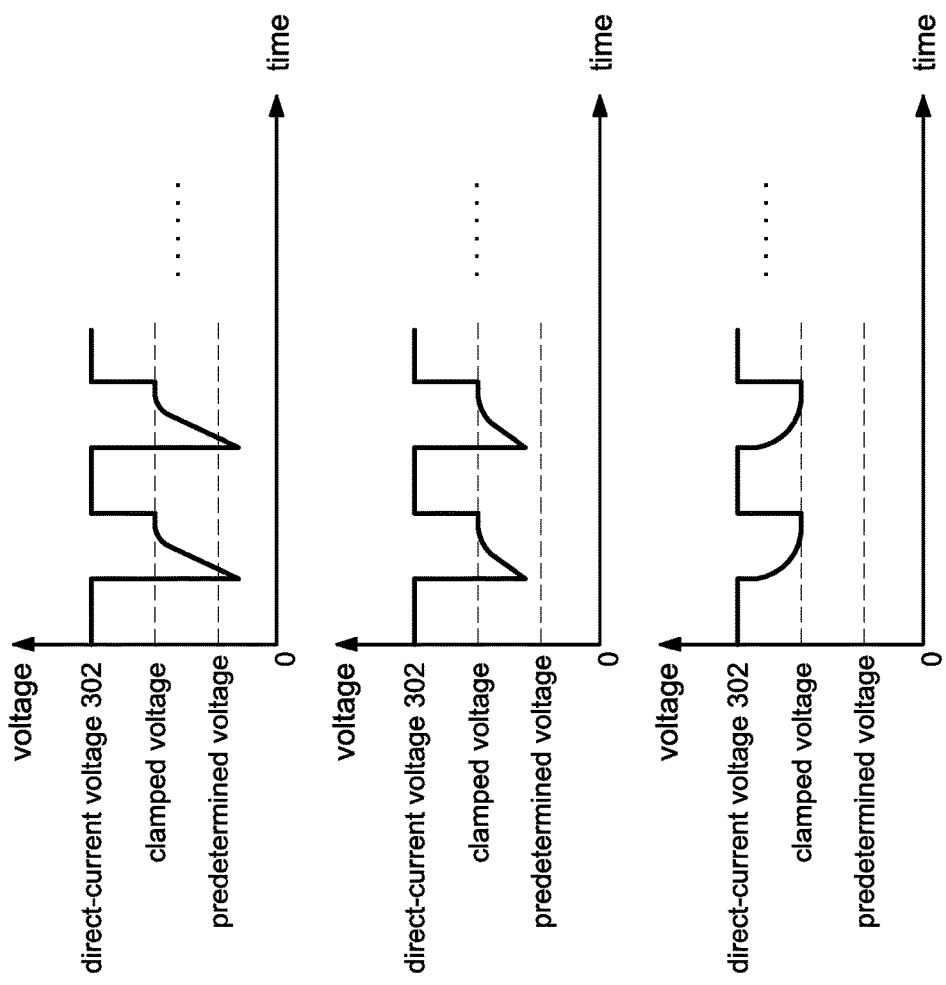
FIG. 3 shows waveform diagrams of an embodiment of the address pulse wave signal received by the light-emitting diode units of the present invention.

FIG. 3 shows waveform diagrams of an embodiment of the address pulse wave signal received by the light-emitting diode units of the present invention. Please refer to FIG. 1 at the same time. In FIG. 3, the first waveform (diagram) from top to bottom is the waveform of the address pulse wave signal received by the first light-emitting diode unit 102 from left to right in FIG. 1. The second waveform (diagram) from top to bottom is the waveform of the address pulse wave signal received by the second light-emitting diode unit 102 from left to right in FIG. 1. The third waveform (diagram) from top to bottom is the waveform of the address pulse wave signal received by the light-emitting diode unit 102 further behind (for example, the last/rightmost light-emitting diode unit 102) in FIG. 1. One should know that FIG. 3 is just a diagram only for convenient descriptions, but the pulled-from-bottom speed of the address pulse wave signal which is received actually is very fast, and its width is very narrow. The speed mentioned above will be faster and its width mentioned above will be narrower if the delay time delayed by the switch component 210 is shorter. Even if its width mentioned above is very narrow, its width mentioned above (or the pulled-down voltage) still can be recognized/identified easily because the clamped voltage is delayed to be sent to the light-emitting diode units 102. Namely, it will not happen that its width mentioned above (or the pulled-down voltage) cannot be recognized/identified because the speed mentioned above is too fast.

Theoretically, the waveform of the address pulse wave signal should be ideally between the direct-current voltage 302 and the clamped voltage according to the on-off of the switch unit 204 and the clamped voltage generation circuit 208. However, because the switch unit 204 is fast switched on and off (with its period between tens of nanoseconds and hundreds of nanoseconds), when the waveform of the address pulse wave signal is pulled down, the overshoot phenomenon is generated. The resistance-capacitance time constant of each of the light-emitting diode units 102 is different after being connected to each other in series. As mentioned above, the resistance-capacitance time constant of the first light-emitting diode unit 102 from left to right is the minimum. The resistance-capacitance time constant relates to charging and discharging. Therefore, the present invention utilizes this feature, the overshoot phenomenon mentioned above, and the delay time delayed by the switch component 210 before generating and sending the clamped voltage to the light-emitting diode units 102. More specifically, the present invention achieves that the address pulse wave signal which is received by the first light-emitting diode unit 102 from left to right in the receiving status decreases to be less than the predetermined voltage. The present invention detects this phenomenon (namely, detects being less than the predetermined voltage) and utilizes this phenomenon to set (namely, find out) the light-emitting diode unit 102 which is nearest to the switch unit 204 and is in the receiving status. With the proper design, the present invention can achieve that only the address pulse wave signal received by the light-emitting diode unit 102 which is nearest to the switch unit 204 and is in the receiving status will be less than the predetermined voltage.

The voltage-detecting subunit 106 of each of the light-emitting diode units 102 in the receiving status detects the receiving voltage of each of the light-emitting diode units 102 respectively, so that the voltage-detecting subunit 106 of the first light-emitting diode unit 102 from left to right detects that the address pulse wave signal is less than the predetermined voltage, and then the first light-emitting diode unit 102 from left to right utilizes the memory 108 to store the address pulse wave signal to have the address sequence data. Then, the first light-emitting diode unit 102 from left to right utilizes (namely, turns on) the by-pass subunit 104 to enters the by-pass status to by-pass the subsequent new address pulse wave signal. The control subunit 110 of the first light-emitting diode unit 102 which is in the by-pass status will also turn off the voltage-detecting subunit 106 so the voltage-detecting subunit 106 will not detect the receiving voltage.

Then, the control unit 202 utilizes the switch unit 204 and the direct-current voltage 302 again to generate the new address sequence data (in the form of the address pulse wave signal). At this time, because the first light-emitting diode unit 102 from left to right is in the by-pass status (similar to the short circuit), the waveform of the address pulse wave signal received by the second light-emitting diode unit 102 from left to right will be the first waveform (diagram) from top to bottom in FIG. 3, and the waveform of the address pulse wave signal received by the third light-emitting diode unit 102 from left to right will be the second waveform (diagram) from top to bottom in FIG. 3, and so on. As the quantity of the light-emitting diode units 102 which are sequenced is increasing, the quantity of the by-pass subunits 104 which are turned on is increasing, so the parasitic capacitive reactance will be gradually decreasing theoretically. Therefore, the subsequent new address pulse wave signal of the present invention can be adjusted, so that the present invention still can achieve that only the address pulse wave signal received by the light-emitting diode unit 102 which is nearest to the switch unit 204 and is in the receiving status will be less than the predetermined voltage. Or, the present invention adds the long enough wire, so the phenomenon mentioned above still can exist.

The control unit 202 is aware of the quantity of the light-emitting diode units 102 (namely, the control unit 202 is aware of that how many address sequence data have to be generated). After all of the light-emitting diode units 102 have been sequenced, the system restarts, rendering that all of the by-pass subunits 104 are turned off. After that, the control unit 202 utilizes the switch unit 204 and the direct-current voltage 302 to generate a lighting signal comprising a lighting data and an address data. The lighting signal is sent to the light-emitting diode units 102. The control subunit 110 controls the light-emitting diode subunit 112 to light based on the lighting data of the lighting signal if the control subunit 110 determines that the address sequence data of the light-emitting diode unit 102 is equal to the address data of the lighting signal. The control subunit 110 ignores the lighting data of the lighting signal if the control subunit 110 determines that the address sequence data of the light-emitting diode unit 102 is not equal to the address data of the lighting signal.

The advantage of the present invention is to simply perform the sequencing of the light-emitting diode units 102 of the light-emitting diode lamp string 10.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A sequencing method applied to a light-emitting diode lamp string comprising a plurality of light-emitting diode units connected to each other in series, the light-emitting diode units having different parasitic capacitive reactance and resistance-capacitance time constant after being connected to each other in series, the sequencing method comprising:
   a. sending an address pulse wave signal to the light-emitting diode units;
   b. sending a clamped voltage to the light-emitting diode units if a voltage of the address pulse wave signal decreases;
   c. detecting a receiving voltage of the light-emitting diode unit by the light-emitting diode unit in a receiving status; and
   d. storing the address pulse wave signal to have an address sequence data by the light-emitting diode unit detecting that the receiving voltage is less than a predetermined voltage due to an overshoot phenomenon.

2. The sequencing method in claim 1, after step d further comprising:
   e. entering a by-pass status to by-pass the address pulse wave signal by the light-emitting diode unit having the address sequence data.

3. The sequencing method in claim 2, wherein the light-emitting diode unit comprises a by-pass subunit, wherein the step e comprises:

using the by-pass subunit to by-pass the address pulse wave signal by the light-emitting diode unit in the by-pass status.

4. The sequencing method in claim 1, wherein the step b comprises:

generating and sending the clamped voltage to the light-emitting diode units by a clamped voltage generation circuit.

5. The sequencing method in claim 4, wherein the step a comprises:

utilizing an on-off of a switch unit by the control unit to control a direct-current voltage received by the switch unit to generate the address pulse wave signal to send the address pulse wave signal to the light-emitting diode units.

6. The sequencing method in claim 5, wherein the step b comprises:

sending the direct-current voltage to a switch component and the clamped voltage generation circuit rendering that the switch component delays the clamped voltage generation circuit to generate and send the clamped voltage to the light-emitting diode units if the control unit turns off the switch unit.

7. The sequencing method in claim 6, wherein the step b comprises:

stopping sending the direct-current voltage to the switch component and the clamped voltage generation circuit if the control unit turns on the switch unit.

8. The sequencing method in claim 6, wherein the clamped voltage generation circuit comprises a zener diode, wherein the switch component is a diode.

9. The sequencing method in claim 1, wherein the light-emitting diode unit comprises a voltage-detecting subunit to detect the receiving voltage of the light-emitting diode unit.

10. The sequencing method in claim 1, wherein the light-emitting diode unit comprises a memory, wherein the step d comprises:

utilizing the memory to store the address pulse wave signal by the light-emitting diode unit to have the address sequence data.

\* \* \* \* \*